United States Patent
Chen

[19]

[11] Patent Number: 5,994,192
[45] Date of Patent: Nov. 30, 1999

[54] COMPENSATION OF THE CHANNEL REGION CRITICAL DIMENSION, AFTER POLYCIDE GATE, LIGHTLY DOPED SOURCE AND DRAIN OXIDATION PROCEDURE

[75] Inventor: Chun-Yao Chen, Hsinchu, Taiwan

[73] Assignee: Vanguard International Semiconductor Corporation, Hsin-Chu, Taiwan

[21] Appl. No.: 09/087,820

[22] Filed: May 29, 1998

[51] Int. Cl.⁶ .................... H01L 21/336; H01L 21/3205
[52] U.S. Cl. .................... 438/303; 438/305; 438/592
[58] Field of Search .................... 438/301, 303, 438/305, 592, 595

[56] References Cited

U.S. PATENT DOCUMENTS

| | | | |
|---|---|---|---|
| 4,528,066 | 7/1985 | Markling, Jr. et al. | 156/643 |
| 5,364,804 | 11/1994 | Ho et al. | 437/41 |
| 5,368,686 | 11/1994 | Tatsumi et al. | 156/656 |
| 5,545,578 | 8/1996 | Park et al. | 437/44 |
| 5,698,072 | 12/1997 | Fukuda | 156/653.1 |
| 5,821,159 | 10/1998 | Ukita | 438/592 |
| 5,924,000 | 7/1999 | Linliu | 438/592 |
| 5,926,730 | 7/1999 | Hu et al. | 438/592 |
| 5,937,299 | 8/1999 | Michael et al. | 438/299 |

*Primary Examiner*—John F. Niebling
*Assistant Examiner*—Michael S. Lebintritt
*Attorney, Agent, or Firm*—George O. Saile; Stephen B. Ackerman

[57] ABSTRACT

A process for fabricating a MOSFET device has been developed featuring a polycide gate structure, comprised of a metal silicide component, overlying a polysilicon component, and with the metal silicide shape intentionally fabricated to be narrower than the underlying polysilicon shape. This polycide configuration is obtained using an isotropic RIE procedure for the metal silicide shape, while using an anisotropic RIE procedure for the definition of the polysilicon shape. The undercut metal silicide shape can now accommodate a thermally grown oxide layer, thicker than the thermally grown oxide formed on the underlying, straight walled polysilicon shape, and thus allowing a lightly doped source and drain region, and the subsequent MOSFET channel length, to be defined by the thin oxide, on the sides of the straight walled polysilicon shape.

21 Claims, 2 Drawing Sheets

COMPENSATION OF THE CHANNEL REGION CRITICAL DIMENSION, AFTER POLYCIDE GATE, LIGHTLY DOPED SOURCE AND DRAIN OXIDATION PROCEDURE

BACKGROUND OF THE INVENTION (1) Field of the Invention

The present invention relates to processes used to fabricate metal oxide semiconductor field effect transistor, (MOSFET), devices, and more specifically to a process used to create a gate structure for a MOSFET device.

(2) Description of Prior Art

The semiconductor industry is continually striving to increase the performance of semiconductor devices. The ability to create semiconductor devices with sub-micron features, or micro-miniaturization, has allowed this performance objective to be successfully addressed. The use of sub-micron features has resulted in a reduction in performance degrading capacitances and resistances, present with larger dimension, semiconductor devices. Advances in specific semiconductor fabrication disciplines, such as photolithography and dry etching, have contributed to micro-miniaturization of advanced semiconductor devices. For example the use of more advanced exposure cameras, as well as the use of more sensitive photoresist materials, have allowed sub-micron images to be successfully formed in photoresist layers. In addition the development of more sophisticated dry etching tools and processes, have in turn allowed the sub-micron features, in masking photoresist layers, to be successfully transferred to underlying materials, used in the creation of advanced semiconductor devices.

An area, critical for the performance of semiconductor MOSFET devices, is the channel region, or the region of the MOSFET device, located underlying a gate structure, between source and drain regions. The MOSFET source and drain regions are formed self-aligned, to an overlying gate structure, therefore the channel length of the MOSFET device is directly related to the width of the overlying gate structure. The advances in photolithography and dry etching disciplines have allowed gate structures, exhibiting sub-micron widths, to be routinely achieved, therefore resulting in the desired channel lengths, and thus satisfying desired performance objectives. However specific semiconductor process phenomena can interfere with the attainment of the minimum channel lengths offered by the narrow gate width, achieved via advanced photolithographic and dry etching procedures. For example, prior to the creation of a lightly doped source and drain, (LDD), region, self-aligned to a gate structure, a thermal oxidation procedure is performed to protect the sides of the gate structure from the subsequent ion implantation procedure, used to create the LDD region. The gate structure can be a polycide structure, comprised of a metal silicide layer, such as tungsten silicide, overlying a polysilicon layer. The oxidation procedure can create protrusions extending from the exposed sides of the metal silicide component of the polycide gate structure, increasing the width of the gate structure. However of greater concern is the enhanced oxidation rate of the metal silicide component, in relation to the underlying polysilicon component, of the polycide gate structure, resulting in a thicker than desired insulator layer, on the exposed sides of the metal silicide component. This unwanted feature, thicker than desired oxide on the side of the metal silicide, results in an increase in channel length due to the inability of the LDD ion implantation procedure, to self-align to the dimension that the gate structure was designed to.

This invention will describe a process of creating a polycide gate structure, in which a subsequent protective oxide layer, formed on the sides of the polycide gate structure, does not adversely influence the narrow polycide gate width dimension, and thus not adversely influence the channel length of the MOSFET device. This is achieved via a novel dry etching procedure, incorporating anisotropic, as well as isotropic etch cycles, used to form a polycide gate structure exhibiting a shape that will accept the formation of insulator growth, on the exposed sides of the metal silicide component, however without an increases in polycide gate width. Prior art, such as Park, et cl, in U.S. Pat. No. 5,545,578, describe a method for forming a specific polycide shape, used to prevent subsequent oxidation of the exposed polycide sidewall. In contrast this present invention describes the formation of unique polycide shape, which allows subsequent oxidation of the exposed sides to occur, however allowing the unique polycide shape to compensate for the oxidation formation.

SUMMARY OF THE INVENTION

It is an object of this invention to create a MOSFET device in which the channel region of the MOSFET device is created via self alignment of a lightly doped source and drain region to a polycide, (metal silicide-polysilicon), gate structure.

It is another object of this invention to form a metal silicide shape for the polycide gate structure, using an isotropic dry etch procedure, resulting in the metal silicide component of the polycide gate structure, undercutting, and narrower than an overlying insulator capping layer.

It is still another object of this invention to form the polysilicon component of the polycide gate structure, using an anisotropic dry etch procedure, resulting in a straight walled polysilicon component, wider than than overlying metal silicide shape.

It is yet another object of this invention to thermally grow an insulator layer on the exposed sides of the polycide gate structure, comprised of the undercut metal silicide component, and the straight walled polysilicon component, prior to the ion implantation of the lightly doped source and drain region.

In accordance with the present invention a process for creating a polycide gate structure, to be used to define the channel length of a MOSFET device, featuring an isotopically defined, metal silicide component, and an anisotropically defined polysilicon component, has been developed. A gate insulator layer is formed on a semiconductor substrate, followed by the deposition of: a polysilicon layer; a metal silicide layer; a thin silicon oxide layer; and a silicon nitride layer. Photolithographic and dry etching procedures are used to create an insulator layers, capping the polycide gate structure, using an anisotropic, reactive ion etching, (RIE), procedure, creating the silicon nitride and thin silicon oxide shapes. The procedure used for polycide gate structure definition is than continued using an isotropic RIE procedure, to etch the metal silicide layer, resulting in the metal silicide shape, undercutting the anisotropically defined, overlying insulator shapes. The polycide gate structure is than completed via the use of an anisotropic RIE procedure, applied to the underlying polysilicon layer. A thermal silicon oxide layer is next formed on the exposed sides of the undercut metal silicide shape, and on the straight walled polysilicon shape. An ion implantation procedure, is next performed, creating a lightly doped source and drain region, in the semiconductor substrate, self-aligned to the polycide gate structure. After creation of silicon nitride spacers, on the sides of the polycide gate structure, a heavily doped source and drain region is created in the semiconductor substrate, self-aligned to the polycide gate structure, passivated with the silicon nitride spacers.

BRIEF DESCRIPTION OF THE DRAWINGS

The object and other advantages of this invention are best described in the preferred embodiments with reference to the drawings that include.

DESCRIPTION OF THE PREFERRED EMBODIMENTS

The method of forming a MOSFET device, in which a channel region of the MOSFET device is defined via self-alignment of a lightly doped source and drain region in a semiconductor substrate, to a polycide gate structure, and where the polycide gate structure is comprised of an undercut metal silicide shape, and a straight walled polysilicon shape, will now be described in detail. Although this invention is described for an N channel, MOSFET device, application for a P Channel device can also be accomplished via the use of an N well region, in a P type semiconductor substrate, and the creation of P type, source and drain regions, in the N well region.

Figure 1:
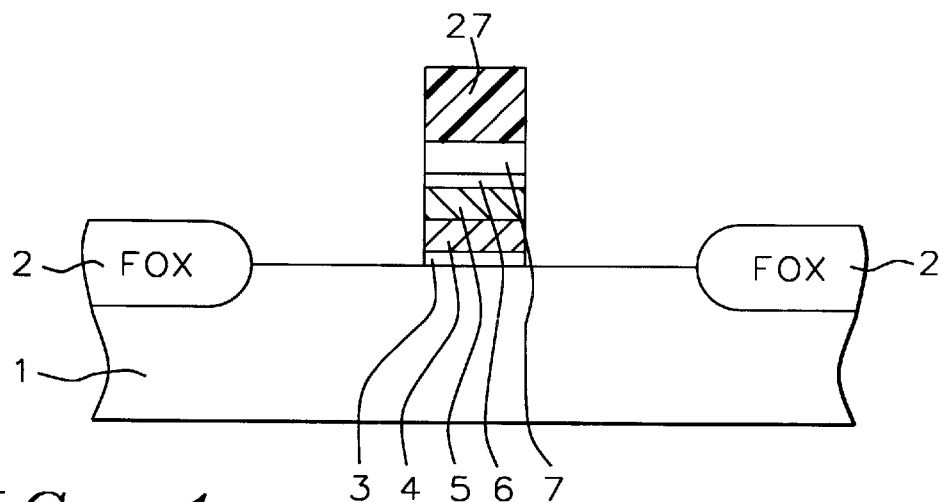
FIGS. 1–3, which schematically in cross-sectional style, illustrate the creation of a MOSFET device, featuring a lightly doped source and drain region, self-aligned to a polycide gate structure, in which only anisotropic RIE procedures are used for patterning of both the metal silicide and the polysilicon components of the polycide gate structure.
Figure 2:
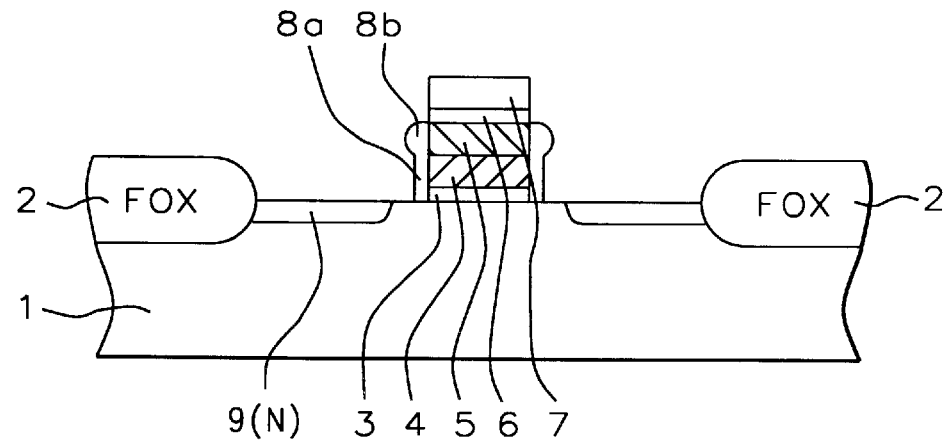
Figure 3:
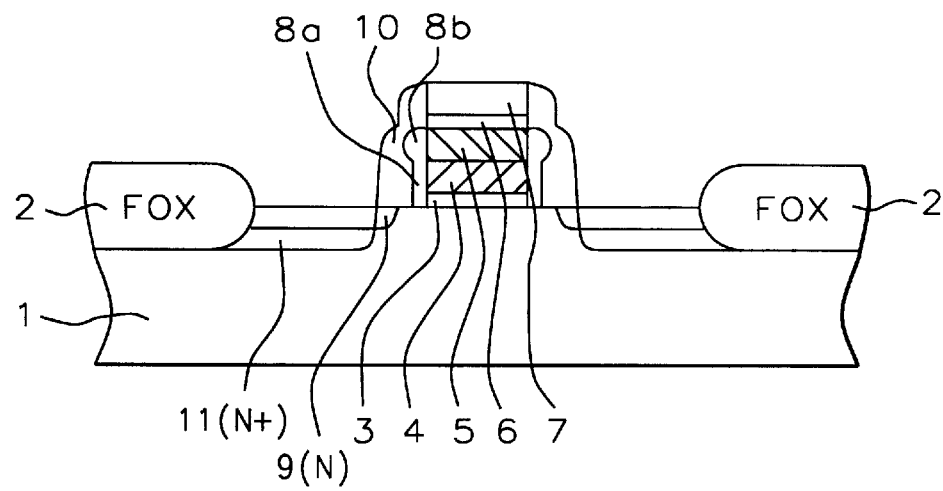

FIGS. 1–3, will describe the creation of a MOSFET device, in which a channel region is formed via self-alignment of a lightly doped source and drain region, to an anisotropically patterned, polycide gate structure, however resulting in a larger than designed channel length, created via the use a polycide gate structure that increased in width via the growth of a thermal oxide layer, on the exposed sides of the straight walled, metal silicide component of the polycide gate structure. A P type, single crystalline silicon substrate, 1, with a <100>crystallographic orientation, shown in FIG. 1, is used. Field oxide regions 2, at a thickness between about 25100 to 4000 Angstroms of thermally grown silicon dioxide, are formed for purposes of isolation, using patterns of silicon nitride as an oxidation mask, during the thermal oxidation of exposed regions of semiconductor substrate 1. After removal of the masking silicon nitride shapes, via use of a hot phosphoric acid solution, followed by careful wet cleans, a silicon dioxide gate insulator layer 3, is thermally grown at a temperature between about 750 to 950° C., to a thickness between about 60 to 120 Angstroms. A polysilicon layer 4, is next deposited via low pressure chemical vapor deposition, (LPCVD), procedures, to a thickness between about 500 to 2000 Angstroms. Polysilicon layer 4, can be doped in situ, during the LPCVD procedure, via the incorporation of arsine, or phosphine, to a silane ambient. Polysilicon lager 4, can also be grown intrinsically, and doped via an ion implantation procedure, using arsenic or phosphorous ions. Next a metal silicide layer 5, comprised of tungsten silicide 5, is deposited, again via LPCVD procedures, to a thickness between about 500 to 2000 Angstroms, using tungsten hexafluoride and silane as reactants. Other metal silicide layers such as titanium silicide, or tantalum silicide, can be used in place of tungsten silicide. A thin silicon oxide layer 6, is deposited, via LPCVD or plasma enhanced chemical vapor deposition (PECVD), procedures, to a thickness between about 200 to 1000 Angstroms, followed by the deposition of silicon nitride layer 7, again obtained via LPCVD or PECVD procedures, to a thickness between about 800 to 2000 Angstroms.

Photolithographic and dry etching procedures, using photoresist shape 27, as a mask, are next used to create a polycide gate structure, comprised of silicon nitride layer 7, thin silicon oxide layer 6, tungsten silicide layer 5, and polysilicon layer 4, on silicon dioxide gate insulator layer 3, schematically shown in FIG. 1. An anisotropic RIE procedure is performed, using $CHF_3$ as an etchant for silicon nitride layer 7, using $CHF_3$ as an etchant for thin silicon oxide layer 6, and using $Cl_2$ as an etchant for both tungsten silicide layer 5, and for polysilicon layer 4. The result of this anisotropic procedure creates the straight walled, polycide, (tungsten silicide-polysilicon gate structure, schematically shown in FIG. 1. The width of the polycide shape is identical to the width of photoresist shape 27, designed to result in a specific, MOSFET channel length. Removal of photoresist shape 27, at the conclusion of the anisotropic RIE procedures, is accomplished using plasma oxygen ashing and careful wet cleans. Regions of silicon dioxide gate insulator layer 3, not covered by the polycide gate structure, are removed during this procedure. The result of these procedures are schematically shown in FIG. 1.

Oxide layers 8a and 8b, used to protect polycide layers during a subsequent ion implantation procedure, are next thermally grown, at a temperature between about 750 to 950° C., on the exposed sides of polysilicon layer 4, and tungsten silicide layer 5. The enhanced oxidation rate of tungsten silicide, compared to polysilicon, results in the thicker oxide layer 8b, between about 150 to 250 Angstroms, formed on the exposed sides of tungsten silicide layer 5, while the thinner oxide layer 8a, between about 70 to 120 Angstroms, is formed on the exposed sides of polysilicon layer 4. An ion implantation procedure, using arsenic or phosphorous ions, is next performed at an energy between about 15 to 30 KeV, at a dose between about 2E13 to 2E14 atoms/cm$^2$, at an implant angle between about 0 to 7 degrees, creating lightly doped source and drain region 9, schematically shown in FIG. 2. The occurrence of thick oxide layer 8b, influenced the placement of lightly doped source and drain region 9, resulting in a channel region, between lightly doped source and drain regions 9, wider than desired. The desired space between lightly doped source and drain regions 9, is the width of the polycide gate structure, or the width of photoresist shape 27, which was used as a mask for polycide patterning. Thus the enhanced oxidation rate of tungsten silicide layer 5, adversely influenced the channel length, and thus the performance of the MOSFET device. In addition, tungsten silicide features may protrude from the sides of patterned tungsten silicide layer 5, and after formation of oxide layer 8b, and this can also adversely influence the placement of lightly doped source and drain regions 9, resulting in increased channel lengths. The tungsten silicide protrusions are not shown in FIG. 2.

Silicon nitride spacers 10, are next created via deposition of a silicon nitride layer, via LPCVD or PECVD procedures, to a thickness between about 400 to 1000 Angstroms, followed by an anisotropic RIE procedure, using $CHF_3$ as an etchant. The thick oxide layer 8b, influenced the shape of silicon nitride spacers 10, shown schematically in FIG. 3. Finally heavily doped source and drain regions 11, are formed, via ion implantation of arsenic or phosphorous ions, at an energy between about 25 to 40 KeV, at a dose between about 2E15 to 2E16 atoms/$cm^2$, and at an ion implantation angle between about 0 to 7 degrees.

Figure 4:
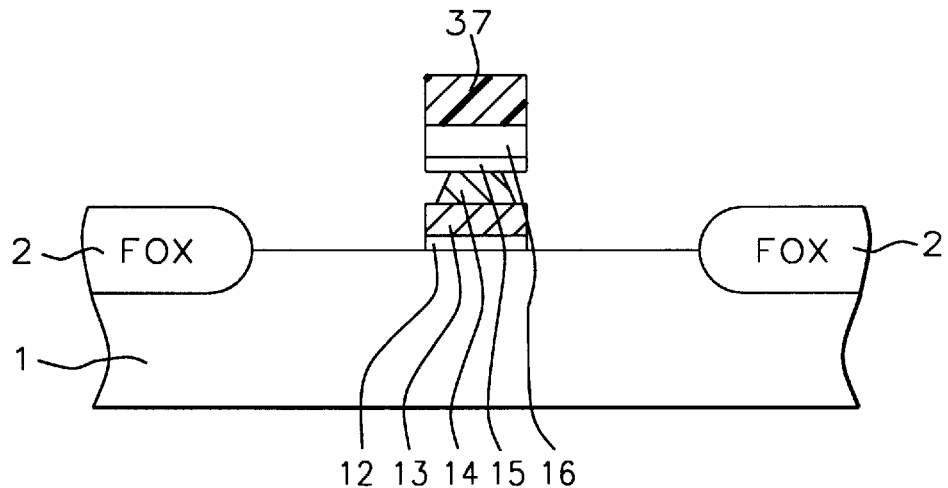
FIGS. 4–6, which schematically, in cross-sectional style, illustrate the creation of a MOSFET device, in which the polycide gate structure, used for subsequent self-alignment of a lightly doped source and drain region, is formed using an isotropic RIE procedure to create the metal silicide component of the polycide gate structure, while an anisotropic RIE procedure is used for the polysilicon component of the polycide gate structure.

The method used to create a MOSFET device, in which the oxide growth on exposed sides of a polycide gate structure, formed prior to implantation of a lightly doped source and drain region, does not adversely influence the MOSFET channel length, will now be described. Referring to FIG. 4, a silicon dioxide gate insulator layer 12, is again thermally grown to a thickness between about 60 to 120 Angstroms, followed by the deposition of polysilicon layer 13, using LPCVD procedures, to a thickness between about 500 to 2000 Angstroms. Polysilicon layer 13, can be in situ doped during the LPCVD procedure via the addition of arsine, or phosphine, to a silane ambient, or polysilicon layer 13, can be grown intrinsically, than doped via ion implantation, using arsenic or phosphorous ions. Tungsten silicide layer 14, is deposited using LPCVD procedures, to a thickness between about 500 to 2000 Angstroms, using tungsten hexafluoride and silane as reactants. Other metal silicide layers, such as titanium silicide, or tantalum silicide, can be used in place of tungsten silicide, if desired. Thin silicon oxide layer 15, deposited using LPCVD or PECVD procedures, at a thickness between about 200 to 1000 Angstroms, and silicon nitride layer 16, deposited using LPCVD or PECVD procedures, at a thickness between about 800 to 2000 Angstroms, are also shown in FIG. 4.

Photoresist shape 37, is next used as a mask, during a RIE procedure that is used to create the desired polycide structure. First an anisotropic RIE procedure is performed, using $CHF_3$ as an etchant for silicon nitride layer 16, followed by another anisotropic RIE procedure, using $CHF_3$ as an etchant for thin silicon oxide layer 15. Next an isotropic RIE procedure, using $Cl_2$ as an etchant, is used to isotopically etch tungsten silicide layer 14. The degree of undercut in tungsten silicide layer 14, shown schematically in FIG. 4, is designed to allow all of a thick oxide layer, to be subsequently formed on the sides of the undercut tungsten silicide shape, to be located underlying silicon nitride layer 16, and thin silicon oxide layer 15. This is necessary since the oxide grown on tungsten silicide layer 14, will be thicker than the oxide that will be grown on polysilicon layer 13. If the undercut tungsten silicide shape were not used, the thick oxide formed on the sides of tungsten silicide would again interfere with the lightly doped source and drain ion implantation procedure, creating a larger than desired, MOSFET channel length. The isotropic RIE procedure, used to obtain the undercut shape, for tungsten silicide layer 14, was performed at a pressure between about 15 to 25 mTorr. An anisotropic RIE procedure is than employed, at a pressure between about 2 to 4 mTorr, using $Cl_2$ as an etchant for polysilicon layer 13, creating the straight walled polysilicon shape, which will be used for definition of the lightly doped source and drain region, and thus for definition of the MOSFET channel region.

Figure 5:
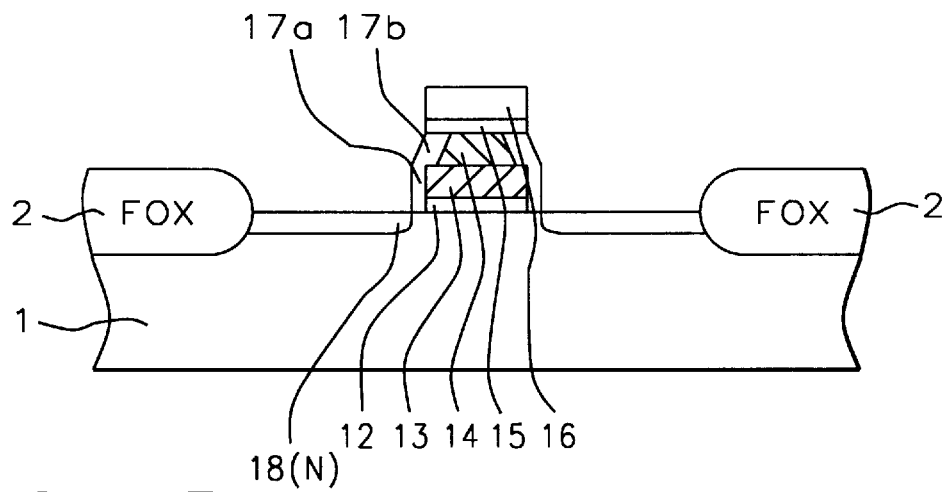

Photoresist shape 37, is removed using plasma oxygen ashing and careful wet cleans, also resulting in the removal of silicon dioxide gate insulator layer 12, in regions in which silicon dioxide gate insulator layer 12, was not covered by the polycide gate structure. Silicon oxide layers 17a, and 17b, are next thermally grown on the exposed sides of polysilicon layer 13, and tungsten silicide layer 14, respectfully, at a temperature between about 750 to 950° C. The thicker silicon oxide layer 17b, between about 150 to 250 Angstroms, on the exposed sides of tungsten silicide layer 14, is located completely underlying silicon nitride layer 16, and thin silicon oxide layer 15. Silicon oxide layer 17a, formed on the sides of polysilicon layer 13, is between about 70 to 120 Angstroms, in thickness. This is schematically shown in FIG. 5. A lightly doped source and drain region 18, is now formed, via an ion implantation procedure, using arsenic or phosphorous ions, at an energy between about 15 to 30 KeV, at a dose between about 2E13 to 2E14 atoms/$cm^2$, and at an implant angle between about 0 to 7 degrees. Lightly doped source and drain regions 18, were defined by the width of polysilicon layer 13, with the sides of polysilicon layer 13, covered with thin silicon oxide layer 17a. The thicker silicon oxide layer 17b, on the sides of tungsten silicide layer 14, did not influence the ion implantation procedure, as a result of the undercut shape. Therefore the space between lightly doped source and drain regions 18, equal to the dimension of photoresist shape 37, used to define the polycide gate structure, will define the MOSFET channel length. This is shown schematically in FIG. 5.

Figure 6:
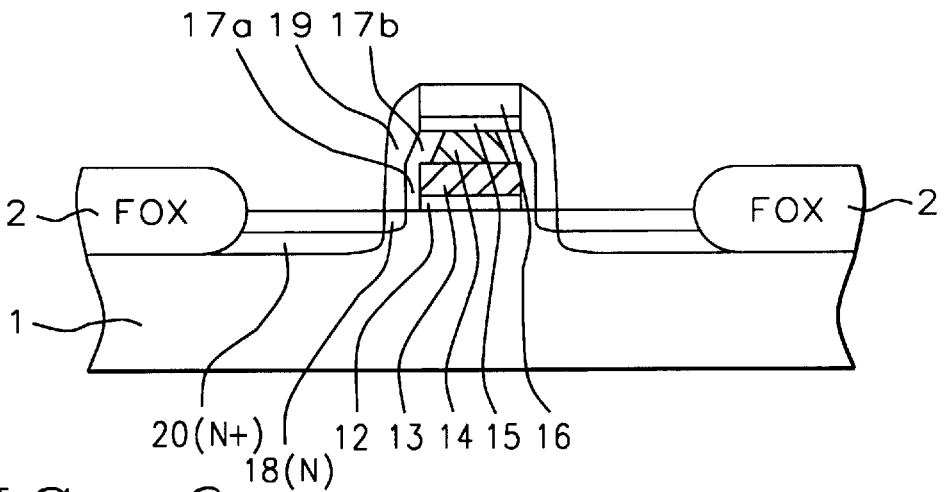

Silicon nitride spacers 19, are next formed via deposition of a silicon nitride layer, via an LPCVD or a PECVD procedure, to a thickness between about 400 to 1000 Angstroms, followed by an anisotropic RIE procedure, using $CHF_3$ as an etchant for silicon nitride. A heavily doped source and drain region 20, is next formed, in regions of semiconductor substrate 1, not covered by the polycide gate structure, and not covered by silicon nitride spacers 19, via ion implantation of arsenic or phosphorous ions, at an energy between about 25 to 40 KeV, at a dose between about 2E15 to 2E16 atoms/$cm^2$, and at an implantation angle between about 0 to 7 degrees. This is schematically shown in FIG. 6.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a MOSFET device, on a semiconductor substrate, comprising the steps of:

forming a gate insulator layer on said semiconductor substrate;

depositing a polysilicon layer;

depositing a metal silicide layer;

depositing a composite insulator layer;

forming a photoresist shape;

anisotropic etching of said composite insulator layer, using said photoresist shape as an etch mask, creating a straight walled composite insulator shape, with the width of said straight walled composite insulator shape equal to the width of said photoresist shape;

forming a polycide gate structure comprised of a metal silicide shape, on a polysilicon shape, via isotropic etching of said metal silicide layer, creating said metal silicide shape, with the width of said metal silicide shape narrower than the width of said photoresist shape, and via an anisotropic etching of said polysilicon layer, using said photoresist shape as a mask, creating a straight walled polysilicon shape, with the width of said straight walled polysilicon shape equal to the width of said photoresist shape;

growing a first oxide layer on the exposed sides of said metal silicide shape;

growing a second oxide layer on the exposed sides of said straight walled polysilicon shape;

ion implanting a first conductivity imparting dopant into a region of said semiconductor substrate, defined by said second oxide layer, on the sides of said straight walled polysilicon shape, to form a lightly doped source and drain region;

forming insulator spacers on the sides of said composite insulator shape, and on the sides of said polycide gate structure; and ion implanting a second conductivity imparting dopant into a region of said semiconductor substrate, defined by said insulator spacers, on the sides of said polycide gate structure, to form a heavily doped source and drain region.

2. The method of claim 1, wherein said gate insulator layer is silicon dioxide, thermally grown at a temperature between about 750 to 950° C., to a thickness between about 60 to 120 Angstroms.

3. The method of claim 1, wherein said polysilicon layer is deposited using LPCVD procedures, to a thickness between about 500 to 2000 Angstroms.

4. The method of claim 1, wherein said metal silicide layer is tungsten silicide, deposited using LPCVD procedures, to a thickness between about 500 to 2000 Angstroms, using silane and tungsten hexafluoride as reactants.

5. The method of claim 1, wherein said composite insulator layer is comprised of an overlying silicon nitride layer, obtained via LPCVD or PECVD procedures, at a thickness between about 800 to 2000 Angstroms, and of an underlying silicon oxide layer, obtained via LPCVD or PECVD procedures, at a thickness between about 200 to 1000 Angstroms.

6. The method of claim 1, wherein said metal silicide shape is formed via an isotropic RIE procedure, at a pressure between about 15 to 25 mTorr, using $Cl_2$ as an etchant for said metal silicide layer.

7. The method of claim 1, wherein said straight walled polysilicon shape is formed via an anisotropic RIE procedure, at a pressure between about 2 to 4 mTorr, using $Cl_2$ as an etchant for said polysilicon layer.

8. The method of claim 1, wherein said first oxide layer is a silicon oxide layer, thermally grown on the sides of said metal silicide shape, at a temperature between about 750 to 950° C., to a thickness between about 150 to 250 Angstroms.

9. The method of claim 1, wherein said second oxide layer is silicon oxide, thermally grown on the sides of said straight walled polysilicon shape, at a temperature between about 750 to 950° C., to a thickness between about 70 to 120 Angstroms.

10. The method of claim 1, wherein said first conductivity imparting dopant, used to create said lightly doped source and drain regions, is phosphorous or arsenic ions, ion implanted at an energy between about 15 to 30 KeV, at a dose between about 2E13 to 2E14 atoms/cm$^2$, and at an implant angle between about 0 to 7 degrees.

11. The method of claim 1, wherein said insulator spacers are silicon nitride, formed via deposition of a silicon nitride layer, using PECVD or LPCVD procedures, to a thickness between about 400 to 1000 Angstroms, followed by an anisotropic RIE procedure, using $CHF_3$ as an etchant.

12. The method of claim 1, wherein said second conductivity imparting dopant, used to create said heavily doped source and drain regions, is arsenic or phosphorous ions, ion implanted at an energy between about 25 to 40 KeV, at a dose between about 2E15 to 2E16 atoms/cm$^2$, and at an implant angle between about 0 to 7 degrees.

13. A method for fabricating a MOSFET device, on a semiconductor substrate, featuring a polycide gate structure comprised of a tungsten silicide shape overlying a polysilicon shape, and with the width of tungsten silicide shape, narrower than the width of said polysilicon shape, comprising the steps of:

forming a silicon dioxide gate insulator layer on said semiconductor substrate;

depositing a polysilicon layer on said silicon dioxide gate insulator layer;

depositing a tungsten silicide layer on said polysilicon layer;

depositing a thin silicon oxide layer on said tungsten silicide layer;

depositing a first silicon nitride layer on said thin silicon oxide layer;

forming a photoresist shape on said first silicon nitride layer;

anisotropic reactive ion etching of said first silicon nitride layer, and of said thin silicon oxide layer, using said photoresist shape as a mask, to create a straight walled composite insulator shape, with said straight walled composite insulator shape having a width equal to the width of said photoresist shape;

forming said polycide gate structure, via isotropic reactive ion etching of said tungsten silicide layer, using said photoresist shape as a mask, to create said tungsten silicide shape, with the width of said tungsten silicide shape narrower than the width of said photoresist shape, and via anisotropic reactive ion etching of said polysilicon layer, using said photoresist shape as a mask, to create a straight walled polysilicon shape, and with the width of said straight walled polysilicon shape equal to the width of said photoresist shape;

thermally growing a first insulator layer on the sides of said tungsten silicide shape, and thermally growing a second insulator layer on the sides of said straight walled polysilicon shape;

ion implanting a first conductivity imparting dopant into a region of said semiconductor substrate, defined by said second insulator layer, on the sides of said straight walled polysilicon shape, to create a lightly doped source and drain region;

depositing a second silicon nitride layer;

anisotropic reactive ion etching of said second silicon nitride layer, to form silicon nitride spacers on the sides of said composite insulator shape, and on the sides of said straight walled polysilicon shape; and ion implanting a second conductivity imparting an area of said semiconductor substrate, defined by said silicon nitride spacers on the sides of said polycide gate structure, to create a heavily doped source and drain region.

14. The method of claim 13, wherein said polysilicon layer is deposited using LPCVD procedures, to a thickness between about 500 to 2000 Angstroms.

15. The method of claim 13, wherein said tungsten silicide layer is deposited using LPCVD procedures, to a thickness between about 500 to 2000 Angstroms, using silane and tungsten hexafluoride as reactants.

16. The method of claim 13, wherein said tungsten silicide shape, of said polycide gate structure, is formed via an isotropic RIE procedure, at a pressure between about 15 to 25 mTorr, using $Cl_2$ as an etchant for said tungsten silicide layer.

17. The method of claim 13, wherein said polysilicon shape, of said polycide gate structure, is formed via an anisotropic RIE procedure, at a pressure between about 2 to 4 mTorr, using $Cl_2$ as an etchant for said polysilicon layer.

18. The method of claim 13, wherein said first insulator layer, is thermally grown on the sides of said tungsten silicide shape, at a temperature between about 750 to 950° C., to a thickness between about 150 to 250 Angstroms.

19. The method of claim 13, wherein said second insulator layer, on the sides of said polysilicon shape, is a silicon oxide layer, thermally grown at a temperature between about 750 to 950° C., to a thickness between about 70 to 120 Angstroms.

20. The method of claim 13, wherein said first conductivity imparting dopant, used to create said lightly doped source and drain region, in said semiconductor substrate, is phosphorous or arsenic ions, implanted at an energy between about 15 to 30 KeV, at a dose between about 2E13 to 2E14 atoms/cm$^2$, at an implant angle between about 0 to 7 degrees.

21. The method of claim 13, wherein said second conductivity imparting dopant, used to create said heavily doped source and drain regions, in said semiconductor substrate, is phosphorous or arsenic ions, implanted at an energy between about 25 to 40 KeV, at a dose between about 2E15 to 2E16 atoms/cm$^2$, at an implant angle between about 0 to 7 degrees.

* * * * *